United States Patent
Anderson et al.

(10) Patent No.: US 7,718,489 B2
(45) Date of Patent: May 18, 2010

(54) DOUBLE-GATE FETS (FIELD EFFECT TRANSISTORS)

(75) Inventors: Brent A. Anderson, Jericho, VT (US); Andres Bryant, Burlington, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 506 days.

(21) Appl. No.: 11/436,480

(22) Filed: May 18, 2006

(65) Prior Publication Data
US 2006/0267111 A1    Nov. 30, 2006

Related U.S. Application Data

(62) Division of application No. 10/908,583, filed on May 18, 2005, now Pat. No. 7,087,966.

(51) Int. Cl.
*H01L 21/336* (2006.01)
(52) U.S. Cl. ............... 438/259; 438/283; 257/E21.623; 257/E21.637
(58) Field of Classification Search ................. 438/283, 438/259; 257/E21.623, E21.637
See application file for complete search history.

(56) References Cited

U.S. PATENT DOCUMENTS

| | | |
|---|---|---|
| 6,300,182 B1 | 10/2001 | Yu |
| 6,433,609 B1 | 8/2002 | Voldman |
| 6,787,418 B2 * | 9/2004 | Chu et al. ................ 438/259 |
| 7,101,762 B2 * | 9/2006 | Cohen et al. ............... 438/283 |
| 7,259,430 B2 * | 8/2007 | Yoon et al. ................ 257/365 |
| 2004/0197996 A1 * | 10/2004 | Chen et al. ................ 438/259 |
| 2005/0056888 A1 * | 3/2005 | Youn et al. ................ 257/331 |
| 2005/0227435 A1 * | 10/2005 | Oh et al. ................... 438/257 |
| 2006/0022253 A1 * | 2/2006 | Anderson et al. .......... 257/315 |

OTHER PUBLICATIONS

Anil, K.G., et al.; Layout density analysis of FinFETs; IEEE 2003; pp. 139-142; 0-7803-7999-3/03.
Ludwig, T., et al.; FinFET technology for future microprocessors; IEEE 2003; pp. 33-34; 0-7803-7815-6/03.
Ieong, M., et al.; High performance double-gate device technology challenges and opportunities; IEEE 2002; pp. 492-495; 0-7695-1561-4/02.
Fu-Liang Yang, et al.; a 65 nm node strained SOI technology with slim spacer; IEEE 2003; pp. 27.2.1-27.2.4; 0-7803-7872-5/03.

* cited by examiner

*Primary Examiner*—Hsien-ming Lee
*Assistant Examiner*—Kevin Parendo
(74) *Attorney, Agent, or Firm*—Schmeiser, Olsen & Watts; Richard M. Kotulak

(57) ABSTRACT

A semiconductor structure and method for forming the same. The structure includes multiple fin regions disposed between first and second source/drain (S/D) regions. The structure further includes multiple front gates and back gates, each of which is sandwiched between two adjacent fin regions such that the front gates and back gates are alternating (i.e., one front gate then one back gate and then one front gate, and so on). The widths of the front gates are greater than the widths of the back gates. The capacitances of between the front gates and the S/D regions are smaller than the capacitances of between the back gates and the S/D regions. The distances between the front gates and the S/D regions are greater than the distances between the back gates and the S/D regions.

7 Claims, 18 Drawing Sheets

US 7,718,489 B2

DOUBLE-GATE FETS (FIELD EFFECT TRANSISTORS)

This application is a Divisional of Ser. No. 10/908,583, filed May 18, 2005 now U.S. Pat. No. 7,087,966.

BACKGROUND OF THE INVENTION

1. Technical Field

The present invention relates to FETs (Field Effect Transistors), and more specifically, to double-gate FETs.

2. Related Art

Dopant fluctuations are becoming a serious problem in Vt (threshold voltage) control in advanced semiconductor devices. As semiconductor devices become smaller and smaller in size, Vt control becomes more difficult. A known solution is to use back gates (in addition to front gates) in the semiconductor devices to control Vt. By adjusting the voltage applied to the back gates, Vt of devices can be adjusted (i.e., controlled). However, back gates occupy chip areas, and as a result, device density is reduced.

As a result, there is a need for a device structure (and method for forming the same), in which chip areas for back gates are relatively small compared to the prior art.

SUMMARY OF THE INVENTION

The present invention provides a semiconductor structure, comprising (a) a semiconductor substrate comprising a substrate top surface; (b) first and second source/drain (S/D) regions on the semiconductor substrate; (c) a first fin region on the semiconductor substrate, wherein the first fin region is disposed between and in direct physical contact with the first and second source/drain regions; (d) a front gate region on the semiconductor substrate, wherein the front gate region is electrically insulated from the first fin region by a first front gate dielectric region, and wherein the first front gate dielectric region and the first fin region comprise a first common interfacing surface that is essentially perpendicular to the substrate top surface; and (e) a back gate region on the semiconductor substrate, wherein the back gate region is electrically insulated from the first fin region by a first back gate dielectric region, wherein the first back gate dielectric region and the first fin region comprise a second common interfacing surface that is essentially perpendicular to the substrate top surface, wherein the first fin region is sandwiched between the front gate region and the back gate region, and wherein a first back gate capacitance between the back gate region and the first S/D region is at least 1.5 times a first front gate capacitance between the front gate region and the first S/D region.

The present invention also provides a semiconductor structure, comprising (a) a semiconductor substrate comprising a substrate top surface; (b) first and second source/drain (S/D) regions on the semiconductor substrate; (c) first, second, and third fin regions being disposed between and in direct physical contact with the first and second source/drain regions, wherein the first fin region is disposed between the second and third fin regions; (d) a front gate region sandwiched between the first and second fin regions, wherein the front gate region is electrically insulated from the first and second fin regions by first and second front gate dielectric regions, respectively, and wherein the first front gate dielectric region and the first fin region comprise a first common interfacing surface that is essentially perpendicular to the substrate top surface; and (e) a back gate region sandwiched between the first and third source/drain regions, wherein the back gate region is electrically insulated from the first and third fin regions by first and second back gate dielectric regions, respectively, wherein the first back gate dielectric region and the first fin region comprise a second common interfacing surface that is essentially perpendicular to the substrate top surface, and wherein a first distance between the first and second fin regions is at least 1.5 times a second distance between the first and third fin regions.

The present invention also provides a semiconductor structure fabrication method, comprising providing (i) a semiconductor layer, (ii) first and second spacer regions on the semiconductor layer, and (iii) a type-1 gate trench region on the semiconductor layer, wherein the type-1 gate trench region is sandwiched between the first and second spacer regions; etching a type-1 gate trench in the type-1 gate trench region and the semiconductor layer; filling the type-1 gate trench so as to form a type-1 gate region, wherein the type-1 gate region is electrically insulated from the semiconductor layer by a type-1 gate dielectric layer, and wherein the type-1 gate region is sandwiched between first and second source/drain (S/D) regions of the semiconductor layer; etching the first spacer region so as to form a first spacer on a first side wall of the type-1 gate region; using the first spacer as a blocking mask to etch the semiconductor layer without etching the first and second source/drain regions so as to form a first fin region on the first side wall of the type-1 gate region; and forming a first type-2 gate block on a second side wall of the first fin region, wherein the first type-2 gate block is electrically insulated from the first fin region, and the first and second source/drain regions.

The present invention also provides a device structure (and method for forming the same), in which chip areas for back gates are relatively small compared to the prior art.

DETAILED DESCRIPTION OF THE INVENTION

Figure 1:
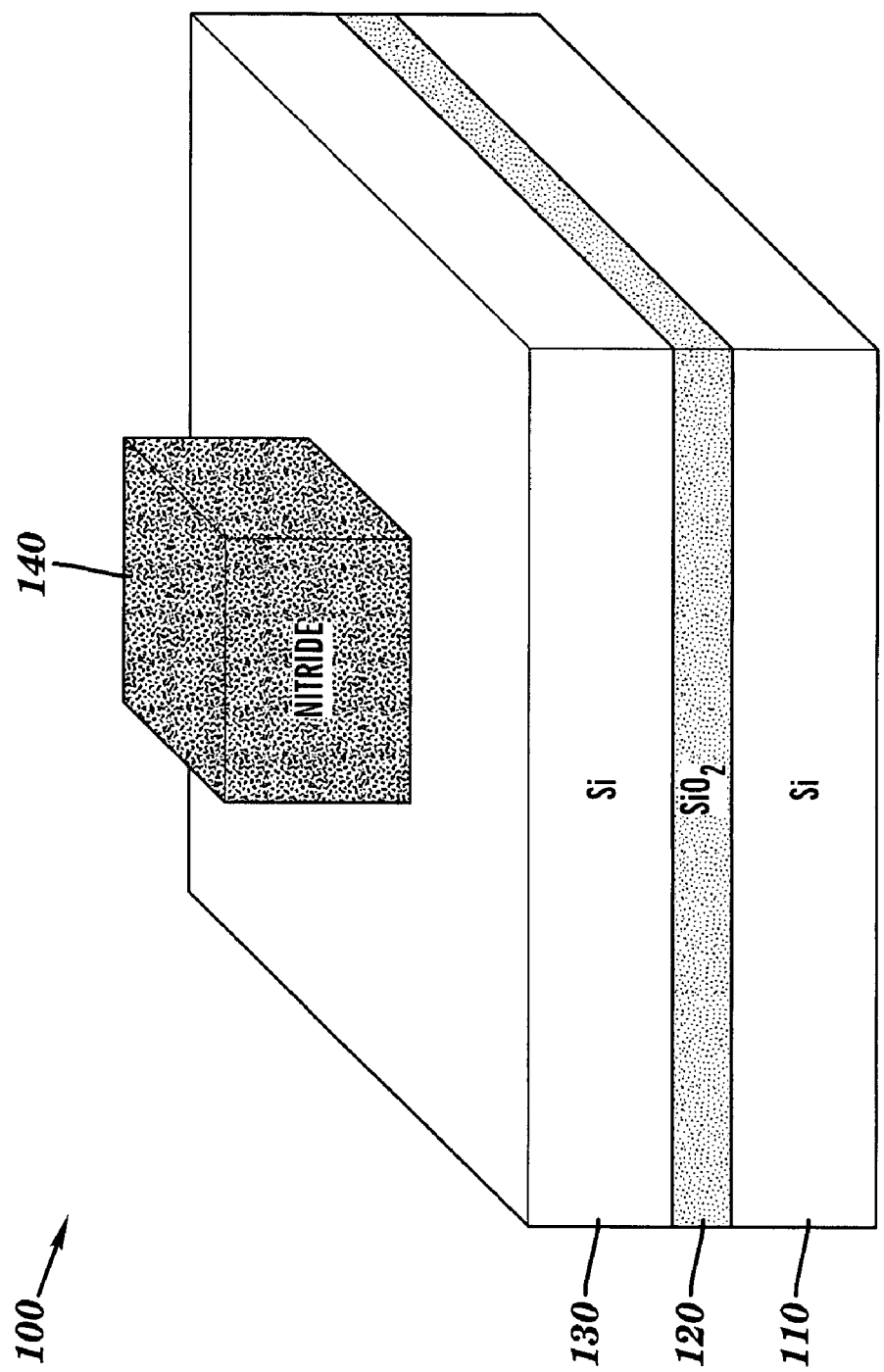
FIGS. 1-12 illustrate a fabrication method for forming a semiconductor structure, in accordance with embodiments of the present invention.

FIGS. 1-11 illustrate a fabrication method for forming a semiconductor structure 100, in accordance with embodiments of the present invention. More specifically, with reference to FIG. 1, the method can start with an SOI (Silicon On Insulator) substrate 110,120,130 which comprises a bottom semiconductor (e.g., silicon, germanium, etc.) layer 110, a buried dielectric (e.g., silicon dioxide, etc.) layer 120, and a top semiconductor layer 130.

Next, a first spacer region 140 can be formed on top of the semiconductor layer 130. In one embodiment, the first spacer region 140 can comprise a nitride material (e.g., silicon nitride). The first spacer region 140 can be formed by (a) forming a first spacer layer (not shown) on top of the semiconductor layer 130, then (b) using a lithography process to form a mask (not shown) to cover portions of the first spacer layer where the first spacer region 140 is to be formed, and finally (c) using the mask as a blocking mask to etch the first spacer layer to form the first spacer region 140. FIG. 1 illustrates a perspective view of the structure 100 after the first spacer region 140 is formed.

Figure 2:
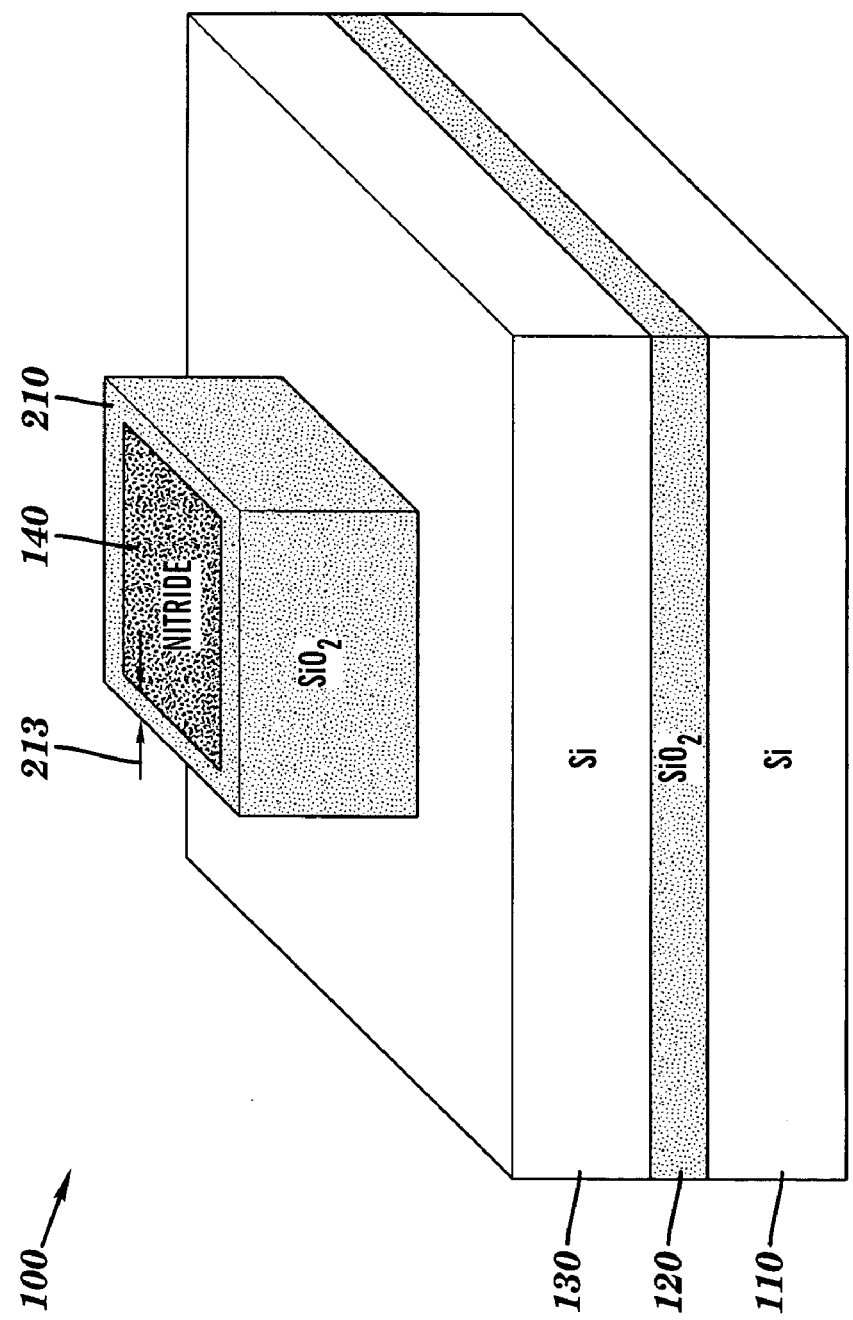

Next, with reference to FIG. 2, a back gate trench region 210 can be formed on the semiconductor layer 130 and on side walls of the first spacer region 140. In one embodiment, the back gate trench region 210 can be formed by forming a back gate trench layer (not shown) on top of the entire structure 100 of FIG. 1, and then directionally etching back the back gate trench layer so as to form the back gate trench region 210. The back gate trench region 210 can comprise silicon dioxide. FIG. 2 illustrates a perspective view of the structure 100 after the back gate trench region 210 is formed.

Figure 3:
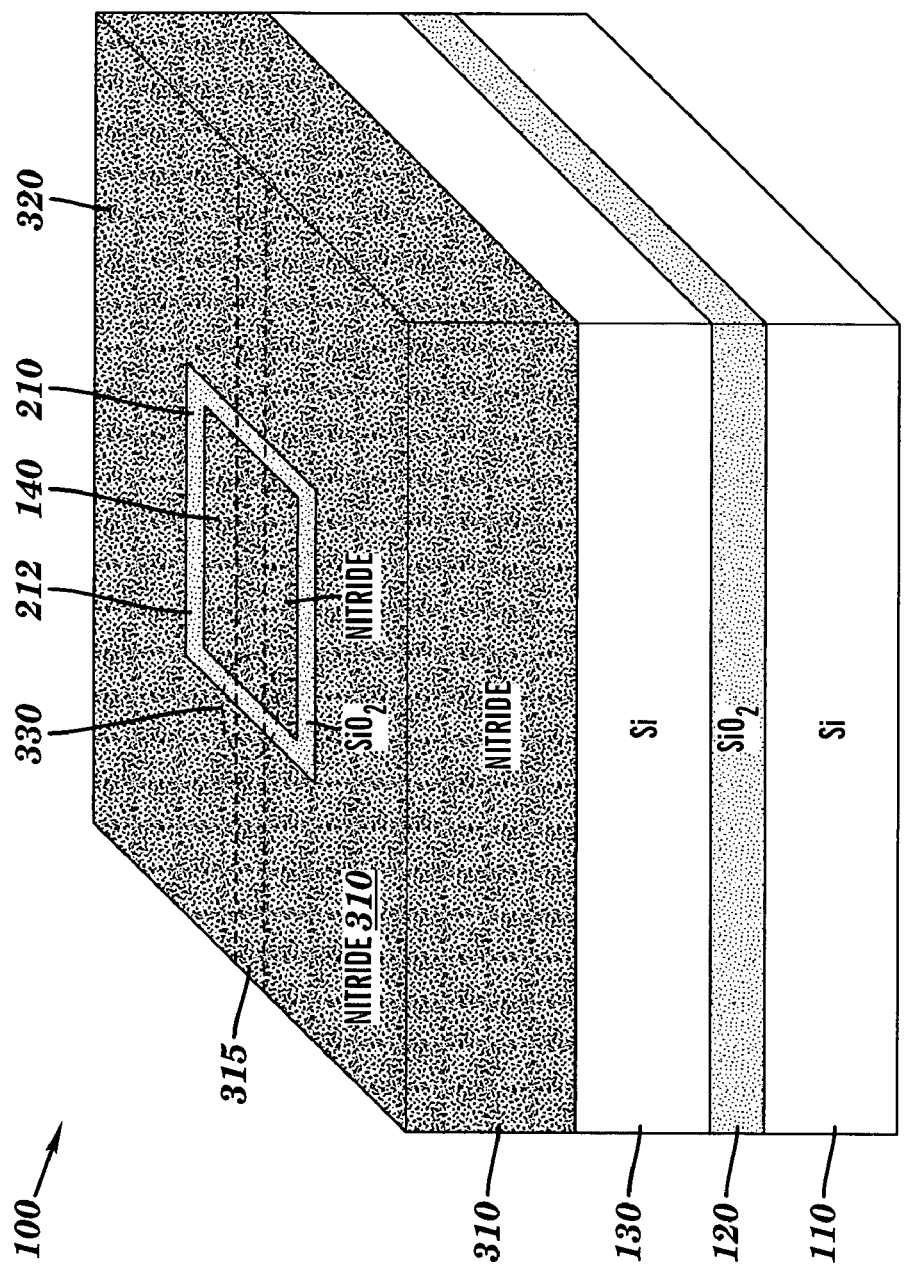

Next, with reference to FIG. 3, a second spacer region 310 can be formed on top of the semiconductor layer 130 and on side walls of the back gate trench region 210. In one embodiment, the second spacer region 310 can comprise a nitride material (e.g., silicon nitride) and can be formed by first depositing a second spacer layer (not shown) of nitride on top of the entire structure 100 of FIG. 2 and then planarizing a top surface (not shown) of the second spacer layer using, illustratively, a CMP (chemical mechanical polishing) process until a top surface 212 of the back gate trench region 210 is exposed to the atmosphere. FIG. 3 illustrates a perspective view of the structure 100 after the CMP process is finished.

Figure 4:
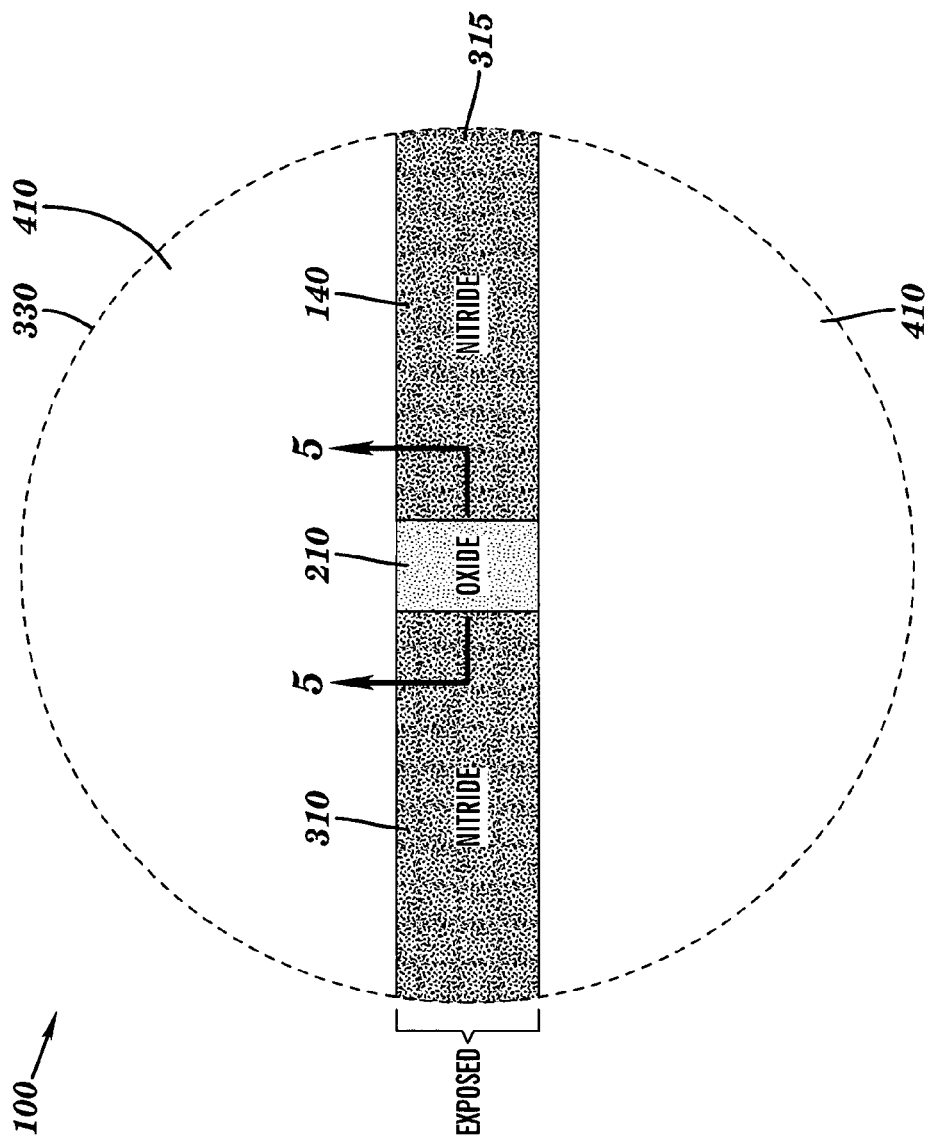
Figure 5:
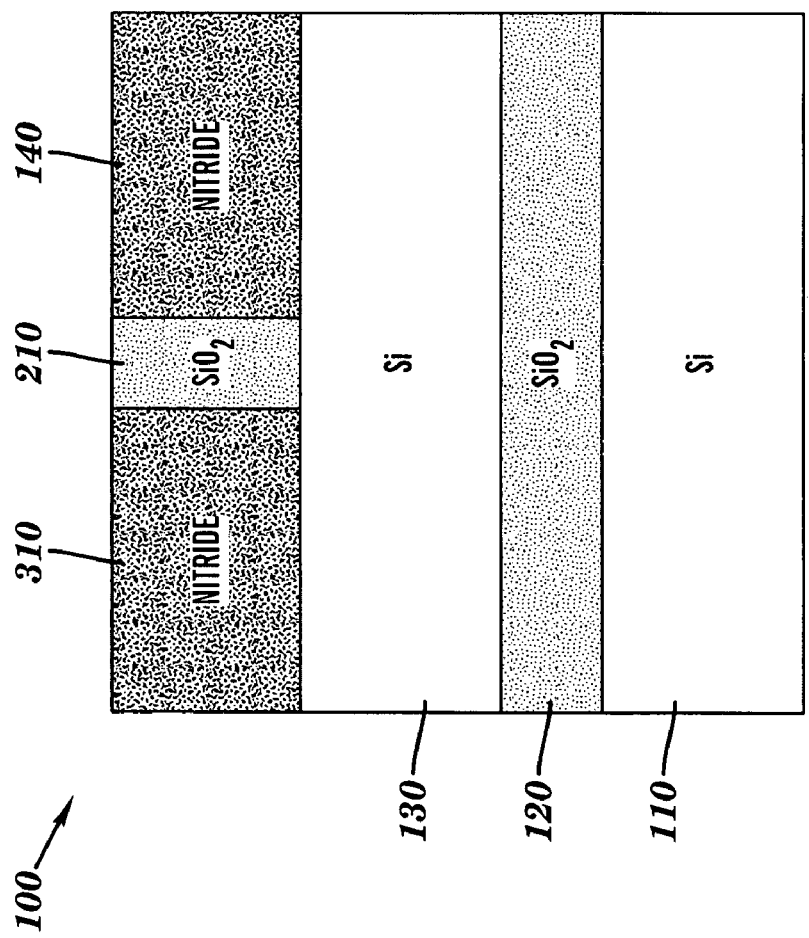

Next, a patterned mask (not shown in FIG. 3, but shown in FIG. 4 as the mask 410) can be formed covering the entire structure 100 of FIG. 3 except a strip 315 of a top surface 320 of the structure 100. FIG. 4 illustrates an enlarged top-down view of a section 150 of the structure 100 of FIG. 3. FIG. 5 illustrates a cross-section view of the structure 100 of FIG. 4 along a line 5-5.

Figure 6:
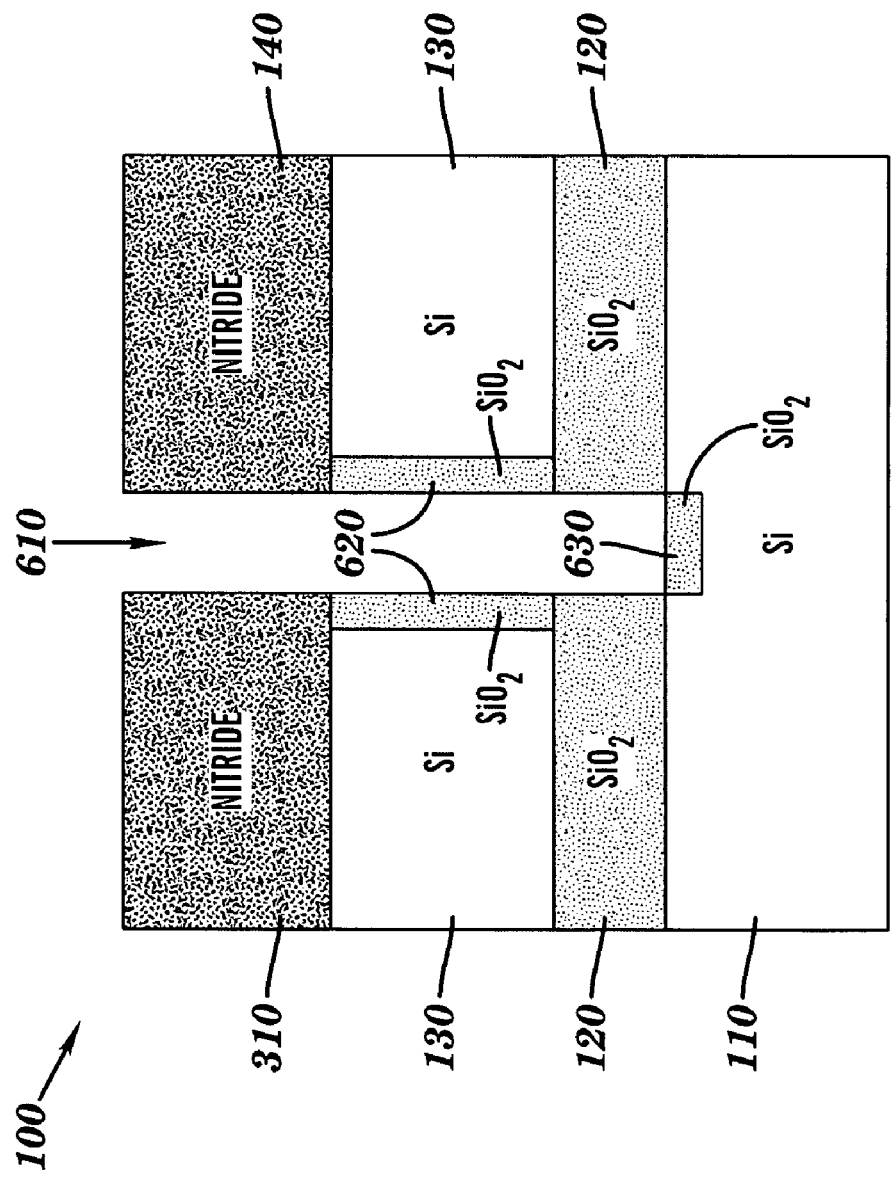

Next, with reference to FIG. 6, a back gate trench 610 can be formed in the back gate trench region 210 (FIG. 5), the semiconductor layer 130, and the buried dielectric layer 120 such that the bottom semiconductor layer 110 is exposed to the atmosphere in the trench 610. In one embodiment, the back gate trench 610 can be formed by first vertically etching the back gate trench region 210 (FIG. 5) using the patterned mask 410 (FIG. 4) as a blocking mask. Then, the back gate trench 610 can be extended down further by vertically etching the top semiconductor layer 130 and then the buried dielectric layer 120 using the patterned mask 410 (FIG. 4), the first spacer region 140, and the second spacer region 310 as a blocking mask. Then, the pattern mask 410 (FIG. 4) can be removed.

Next, a back gate dielectric layer 620 can be formed on the side wall of the back gate trench 610 at the semiconductor layer 130. In one embodiment, the back gate dielectric layer 620 can be formed by thermally oxidizing surfaces of the semiconductor layer 130 that are exposed to the atmosphere in the trench 610. This thermal oxidation process can result in a by-product (the oxide region 630) at the bottom of the back gate trench 610. This is because surfaces of the bottom semiconductor layer 110 that are exposed to the atmosphere in the back gate trench 610 are also thermally oxidized by the thermal oxidation process. FIG. 6 illustrates a cross-section view of the structure 100 after the thermal oxidation process is complete.

Figure 7A:
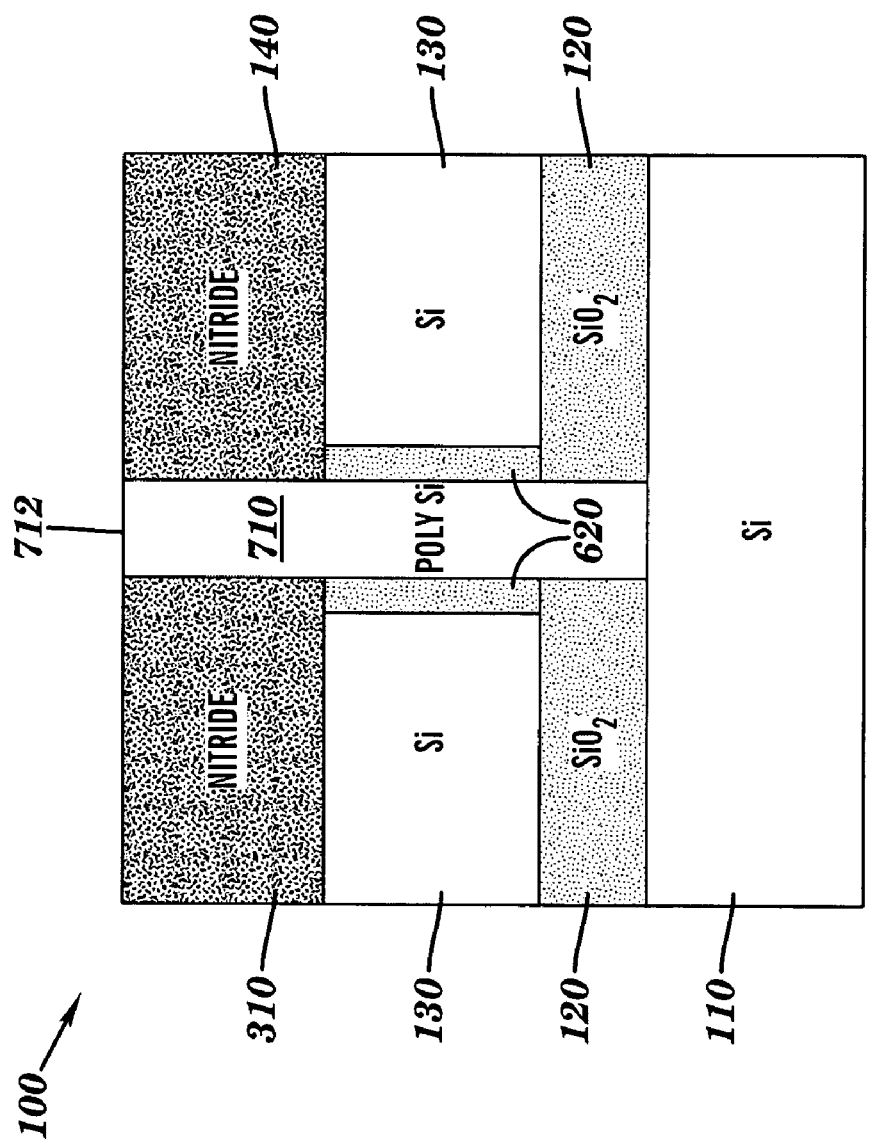

Next, a thin polysilicon layer (not shown) can be formed on the side wall of the trench 610 so as to protect the back gate dielectric layer 620 during the removal of the oxide region 630 at the bottom of the back gate trench 610. In one embodiment, the thin polysilicon layer can be formed by depositing polysilicon on the entire structure 100 of FIG. 6, using, illustratively, a chemical vapor deposition (CVD) process. The deposited polysilicon layer covers not only the back gate dielectric layer 620 on the side wall of the back gate trench 610 but also the oxide region 630 at the bottom of the back gate trench 610. Next, portions of the deposited polysilicon layer at the bottom of the back gate trench 610 can be removed without removing portions of the deposited polysilicon layer on the side wall of the back gate trench 610. This polysilicon removal process can be performed by directionally (i.e., vertically) etching the deposited polysilicon layer. As a result, the oxide region 630 is exposed to the atmosphere in the back gate trench 610 whereas the back gate dielectric layer 620 is still covered by the deposited polysilicon layer. Next, with the back gate dielectric layer 620 being protected by the deposited polysilicon layer, the oxide region 630 at the bottom of the back gate trench 610 can be removed by, illustratively, a wet etching process. Next, polysilicon can be deposited to fill the back gate trench 610 and the extra polysilicon material outside the back gate trench 610 can be removed by, illustratively, a chemical mechanical polishing (CMP) process. A cross-section view of the resultant structure 100 is shown in FIG. 7A in which the polysilicon material that fills the back gate trench 610 (FIG. 6) forms a back gate region 710. It should be noted that because the back gate region 710 is in direct physical contact with the semiconductor layer 110 (i.e., the substrate 110), the back gate region 710 can be electrically accessed via the semiconductor layer 110.

Figure 7B:
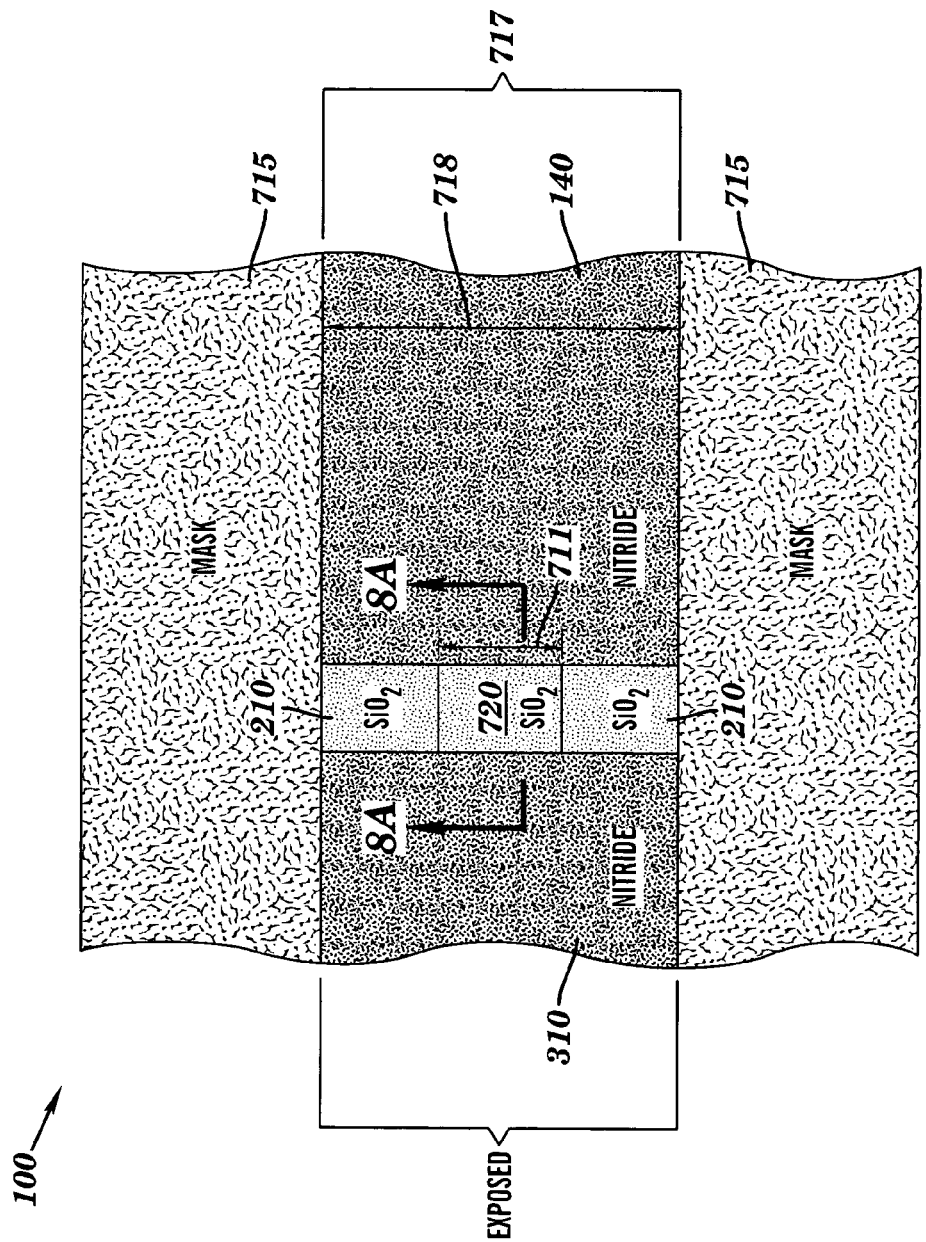

Next, a top surface 712 of the back gate region 710 can be thermally oxidized to form an oxide cap region 720 (FIG. 7B). Next, a patterned mask (not shown in FIG. 7A, but shown in FIG. 7B as the patterned mask 715) can be formed on top of the structure 100 of FIG. 7A. FIG. 7B illustrates a top-down view of the structure 100 of FIG. 7A after the patterned mask 715 is formed. The patterned mask 715 can cover all but a strip 717 of the top surface of the structure 100 such that the entire top surface 712 of the back gate region 710 is still exposed to the atmosphere. In other words, the width 718 of the strip 717 is greater than the width 711 of the back gate region 710.

Figure 8A:
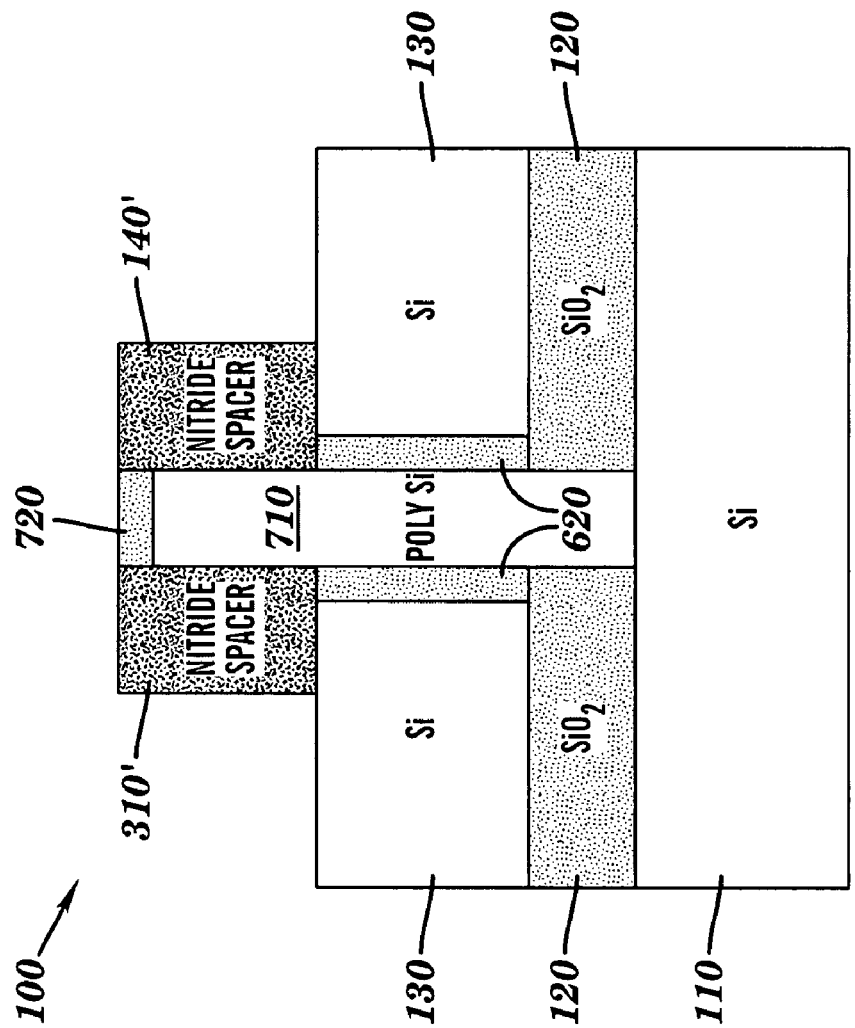
Figure 8B:
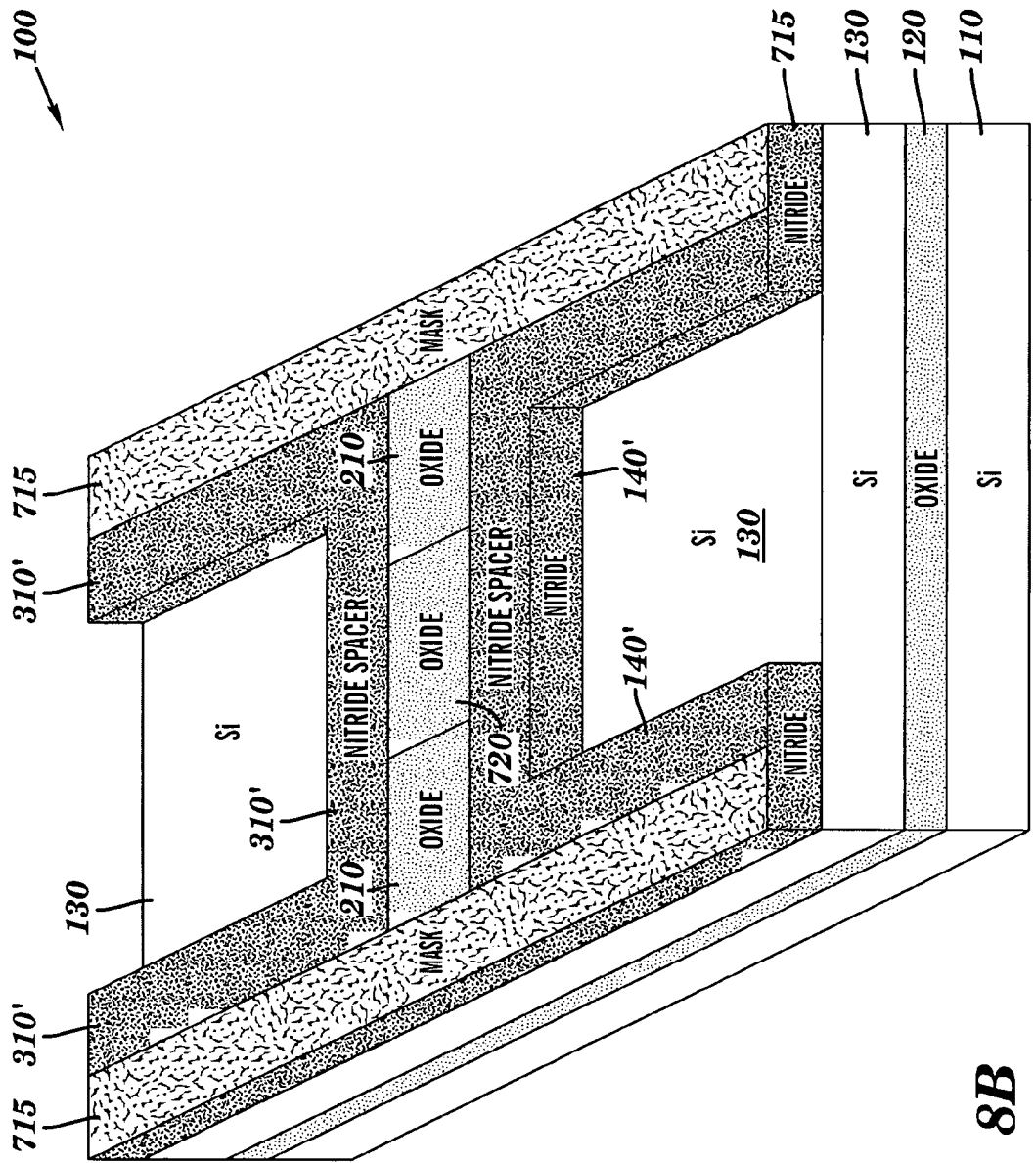

Next, a directional (vertical) etching of the first spacer region 140 and the second spacer region 310 can be performed using the patterned mask 715 as a blocking mask. A cross-section view along the line 8A-8A of the resultant structure 100 is shown in FIG. 8A. As can be seen in FIG. 8A, spacers 140' and 310' are formed on side walls of the back gate region 710 as a result of the directional etching of the first spacer region 140 and the second spacer region 310, respectively. FIG. 8B illustrates a perspective view of the structure 100 of FIG. 8A.

Figure 9A:
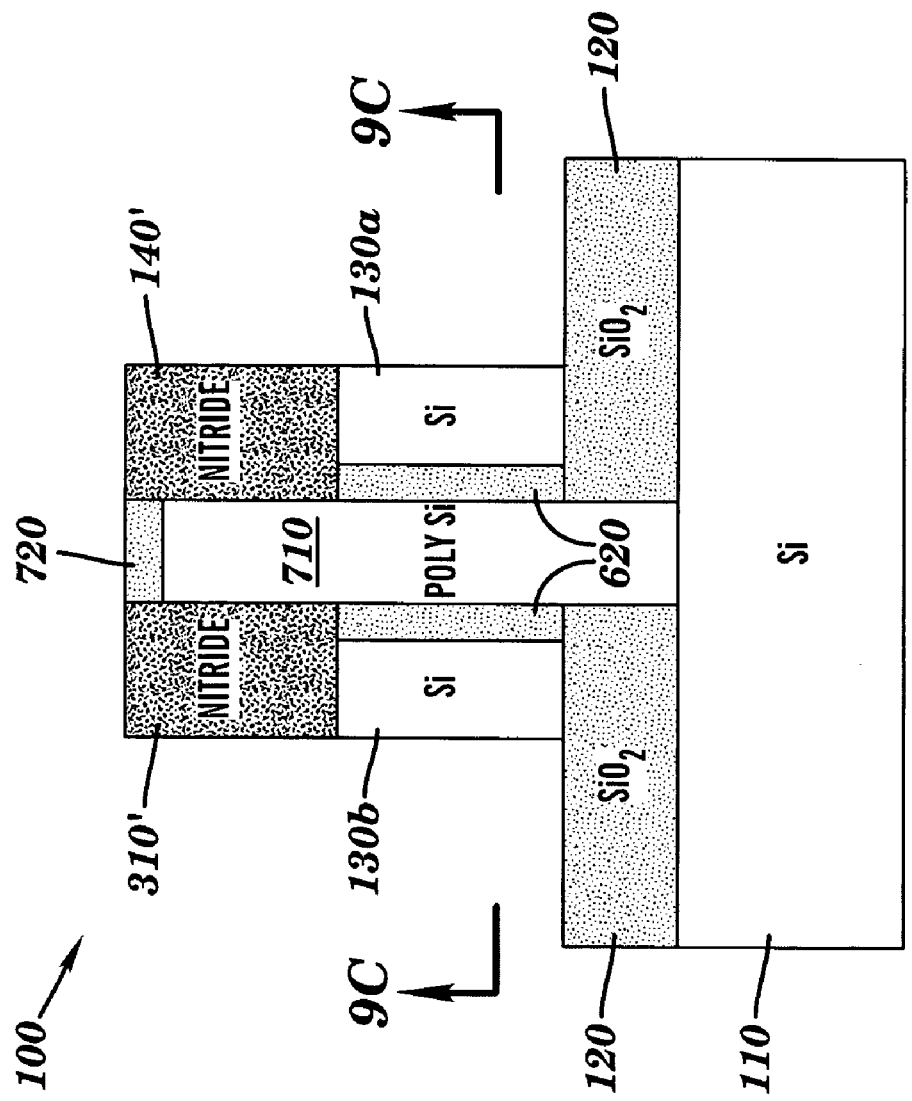
Figure 9B:
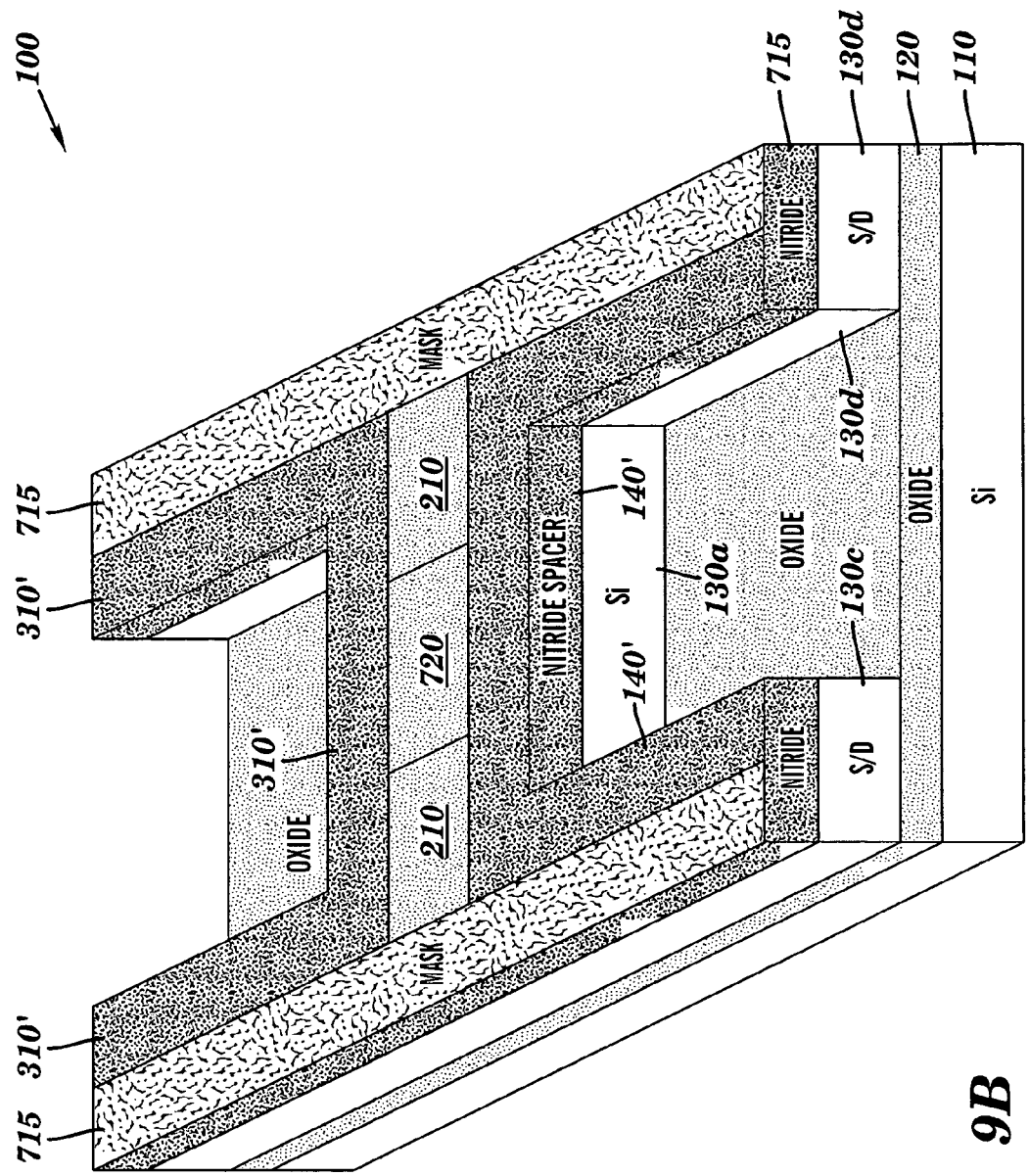
Figure 9C:
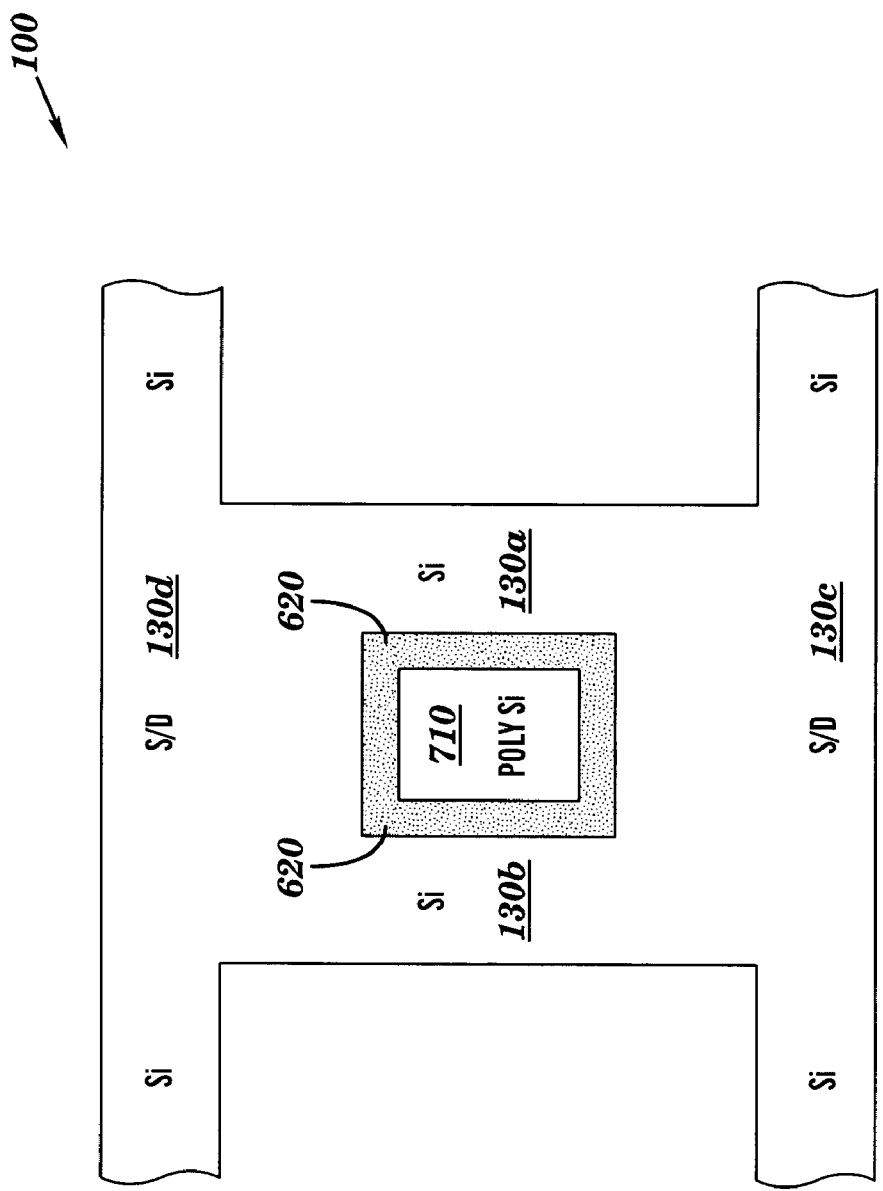

Next, with reference to FIG. 9A, the semiconductor layer 130 can be directionally etched using the spacers 140' and 310' as a blocking mask. As a result, fin regions 130a and 130b are formed on side walls of the back gate region 710 (but electrically insulated from the back gate region 710 by the back gate dielectric layer 620). FIG. 9B illustrates a perspective view of the structure 100 of FIG. 9A. As shown in FIGS. 9A and 9B, the fin regions 130a and 130b are also formed on side walls of the back gate trench region 210. The other portions of the semiconductor layer 130 (other than the fin regions 130a and 130b) will be doped with impurities so as to form source/drain (S/D) regions 130c and 130d. As can be seen in FIGS. 9A and 9B, the purpose of the patterned mask 717 is to define the fin regions 130a and 130b and the source/drain regions 130c and 130d in the semiconductor layer 130 (by defining the spacers 140' and 310'). FIG. 9C illustrates a top-down view of the structure 100 of FIG. 9A along a line 9C-9C.

Figure 10A:
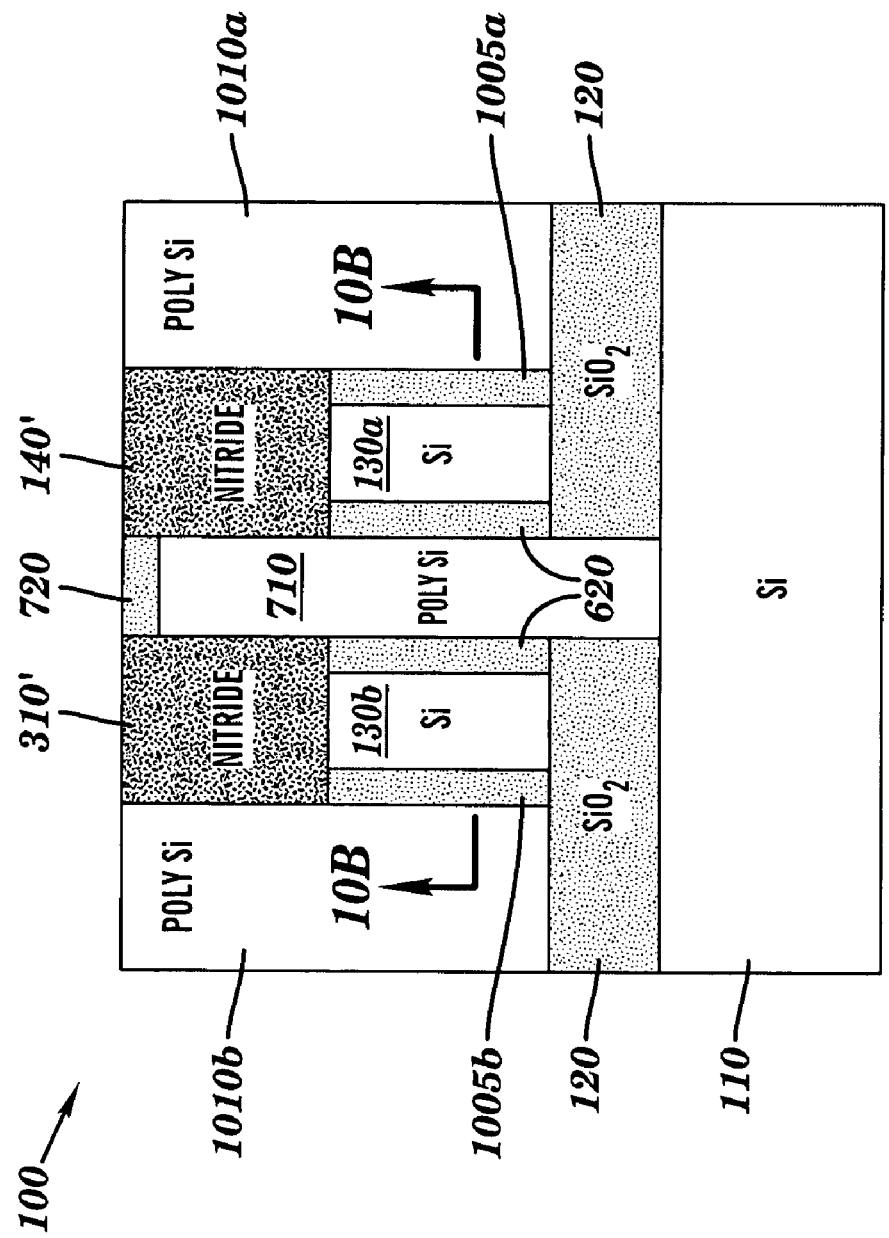

Next, with reference to FIG. 10A, front gate dielectric layers 1005a and 1005b can be formed on side walls of the fin regions 130a and 130b, respectively. In one embodiment, the front gate dielectric layers 1005a and 1005b can be formed by thermally oxidizing surfaces of the fin regions 130a and 130b that are exposed to the atmosphere.

Figure 10B:
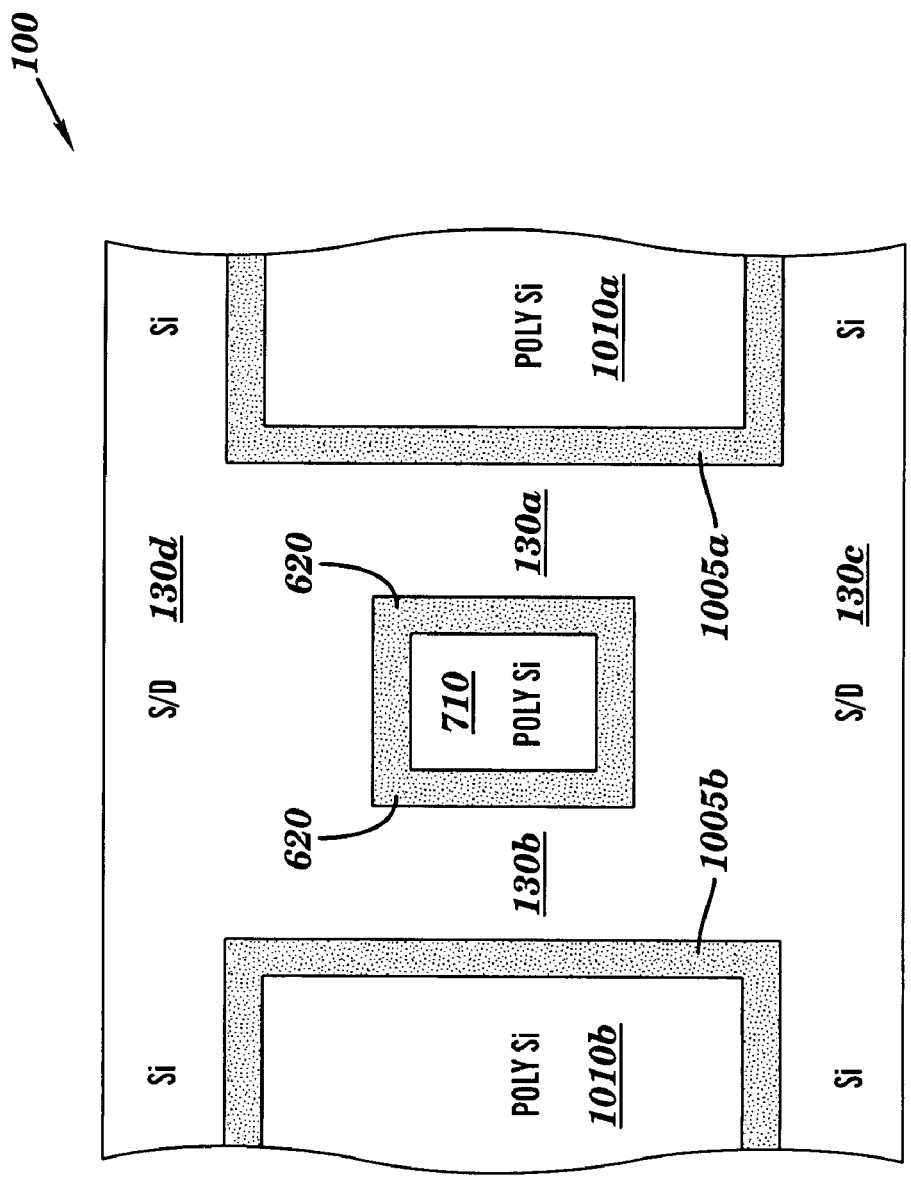

Next, front gate blocks 1010a and 1010b can be formed on side walls of the fin regions 130a and 130b, respectively (but electrically insulated from the fin regions 130a and 130b by the front gate dielectric layers 1005a and 1005b, respectively). In one embodiment, front gate blocks 1010a and 10101b can comprise polysilicon. Illustratively, the front gate blocks 1010a and 1010b can be formed by depositing polysilicon on top of the entire structure 100 of FIG. 9A and then planarizing a top surface of the structure 100. FIG. 10B illustrates a top-down view of the structure 100 of FIG. 10A along a line 10B-10B.

Figure 11A:
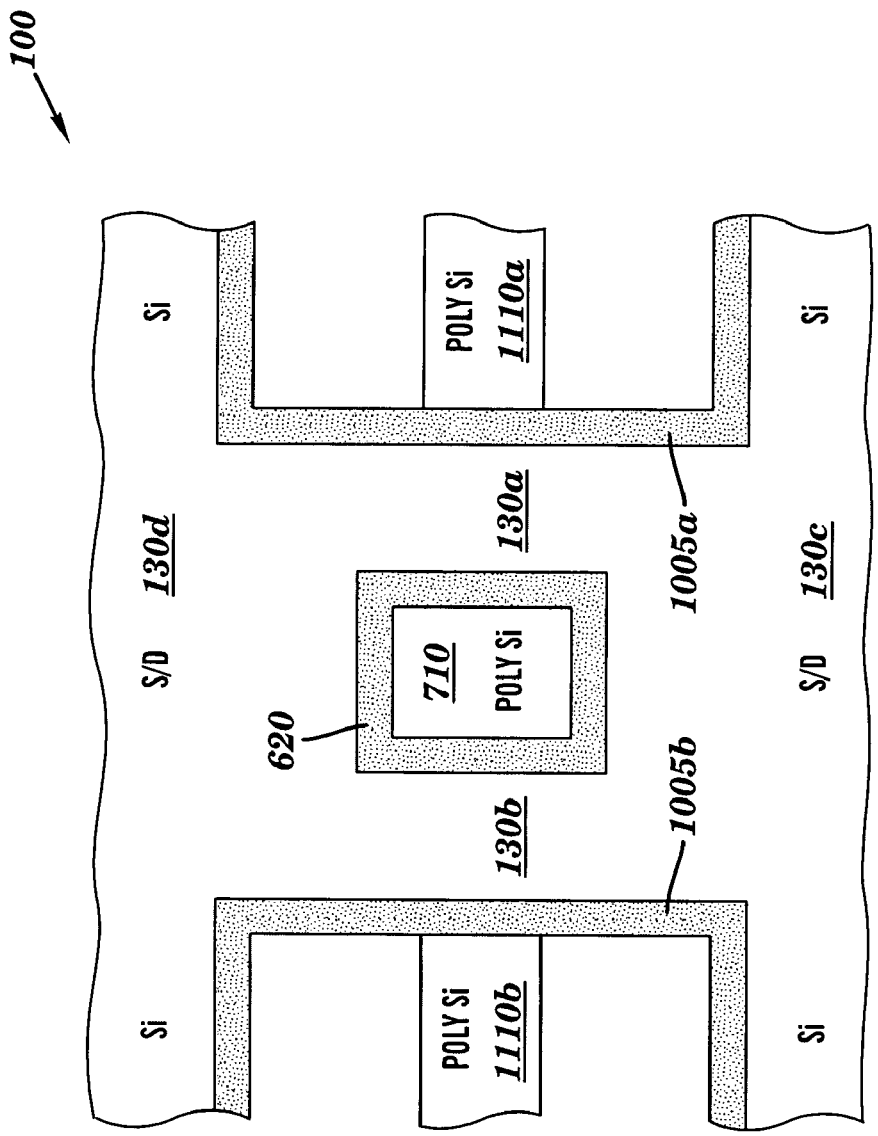
Figure 11B:
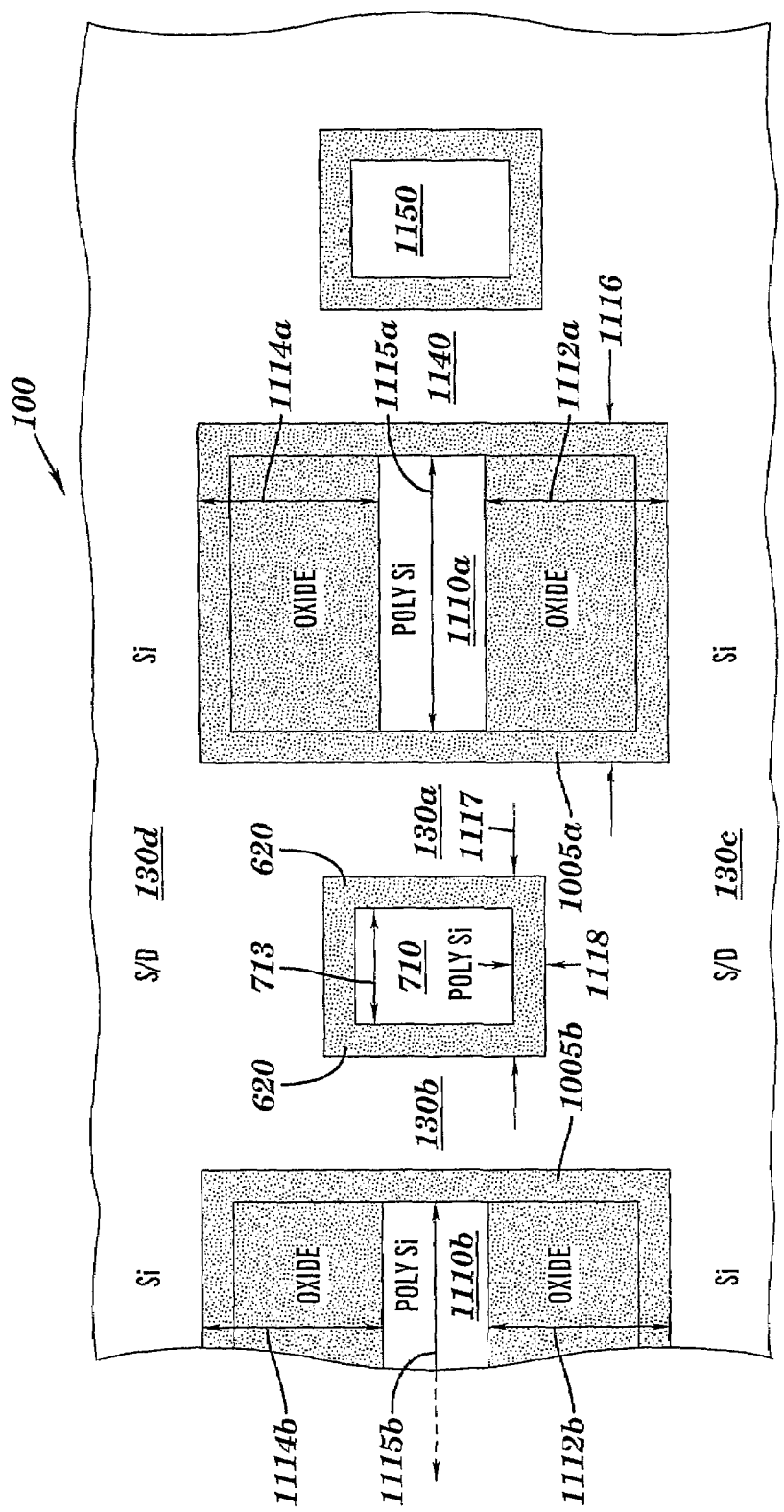

Next, with reference to FIG. 11A, front gate regions 1110a and 1110b can be formed from the front gate blocks 1010a and 10101b (FIG. 10B), respectively. In one embodiment, the front gate regions 1110a and 1110b can be formed by first forming a mask (not shown) on top of the structure 100 of FIG. 10A and then etching the front gate blocks 1010a and 1010b (FIG. 10A) so as to form the front gate regions 1110a and 1110b. Then, the spaces of the removed portions of the front gate blocks 1010a and 1010b of FIG. 10A can be filled with a dielectric material (e.g., silicon dioxide). FIG. 11B illustrates the structure 100 of FIG. 11A after the dielectric filling.

With reference to FIG. 11B, the width 713 of the back gate region 710 is determined by the width 213 of the back gate trench region 210 (FIG. 2). Because the back gate trench region 210 can be formed very thin (i.e., small width 213), the back gate region 710 can be formed very small (i.e., small width 713) resulting in a saving of chip areas. Also as a result, the width 713 of the back gate region 710 can be made substantially smaller than the widths 1115a and 1115b of the front gate regions 1110a and 1110b, respectively.

In FIG. 11B, the view of the structure 100 is expanded to the right so that another fin region 1140 similar to the fin regions 130a and 130b is shown. Also, a back gate region 1150 similar to the back gate region 710 is shown. In one embodiment, the distance 1116 between the fin regions 130a and 1140 is at least 1.5 times the distance 1117 between the fin regions 130a and 130b.

In addition, the distance 1112a between the front gate region 1110a and the S/D region 130c determines a first front gate capacitance between the front gate region 1110a and the S/D region 130c. More specifically, the first front gate capacitance is inversely proportional to the distance 1112a.

Similarly, the distance 1114a between the front gate region 1110a and the S/D region 130d determines a second front gate capacitance between the front gate region 1110a and the S/D region 130d. More specifically, the second front gate capacitance is inversely proportional to the distance 1114a.

Similarly, the distance 1112b between the front gate region 1110b and the S/D region 130c determines a third front gate capacitance between the front gate region 1110b and the S/D region 130c. More specifically, the third front gate capacitance is inversely proportional to the distance 1112b.

Similarly, the distance 1114b between the front gate region 1110b and the S/D region 130d determines a fourth front gate capacitance between the front gate region 1110b and the S/D region 130d. More specifically, the fourth front gate capacitance is inversely proportional to the distance 1114b.

As a result, the distances 1112a, 1114a, 1112b, and 1114b can be determined so as to have the first, second, third, and fourth front gate capacitances (a) being substantially smaller than a first back gate capacitance between the back gate region 710 and the S/D region 130c and (b) being substantially smaller than a second back gate capacitance between the back gate region 710 and the S/D region 130d.

In one embodiment, each of the first, second, third, and fourth front gate capacitances is at least 1.5 times either of the first and second back gate capacitances.

In one embodiment, the distance 1112a is at least 1.5 times a thickness 1118 of the back gate dielectric layer 620.

It should noted that, regarding the back gate region 710, large first and second back gate capacitances may be acceptable in terms of performance because the back gate region 710 is usually held to a fixed voltage during the operation of the structure 100. Regarding the front gate regions 1110a and 1110b whose voltages may be switching during the operation of the structure 100, the first, second, third, and fourth front gate capacitances can be reduced by increasing the distances 1112a, 1114a, 1112b, and 1114b, respectively, so as to minimize the performance degradation due to the first, second, third, and fourth front gate capacitances.

Figure 12:
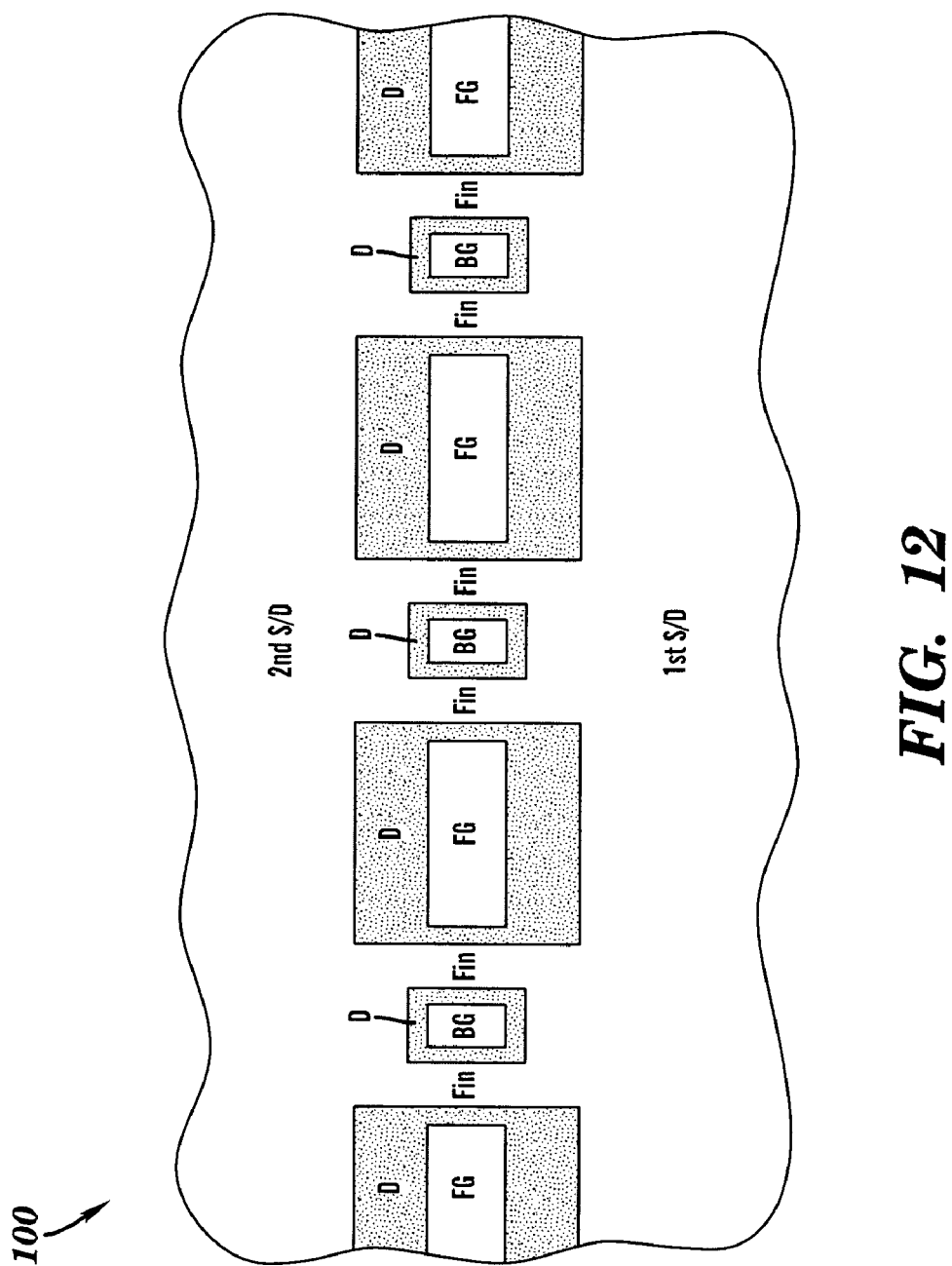

FIG. 12 is a zoom-out view of the structure 100 of FIG. 1B. In FIG. 12, the front gates (FG) and the back gates (BG) are interleaved and disposed between the first and second S/D regions. A fin region is sandwiched between two adjacent front gate and back gate. The front gates and back gates are electrically insulated from the first and second S/D regions and the fin regions by dielectric regions (D).

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A semiconductor structure fabrication method, comprising:

forming a first structure that comprises (i) a semiconductor layer, (ii) first and second spacers on the semiconductor layer, and (iii) sacrificial back gate on the semiconductor layer, wherein the back gate is sandwiched between and is in direct physical contact with the first spacer and the second spacer, wherein said forming the first structure comprises forming the first spacer on the semiconductor layer, followed by forming the sacrificial back gate around the first spacer, followed by forming the second spacer around the sacrificial back gate;

after said forming the first structure, etching away the sacrificial back gate and a portion of the semiconductor layer to form a first gate trench in the first structure, wherein said etching away leaves both the first spacer and the second spacer intact;

filling the first gate trench so as to form a first conductive gate that is electrically insulated from the semiconductor layer by a first gate dielectric layer, wherein said filling results in the first conductive gate being in direct physical contact with both the first spacer and the second spacer, and wherein said filling further results in a top surface of the first conductive gate, a top surface of the first spacer, and a top surface of the second spacer being coplanar;

after said filling, etching a portion of the first spacer which results in a remaining portion of the first spacer being a third spacer on a first side wall of the first conductive gate;

after said etching the portion of the first spacer, using the third spacer as a blocking mask to etch the semiconductor layer so as to form a first fin on the first side wall of the first conductive gate;

after said using the third spacer as the blocking mask, forming a first source/drain and a second source drain in the semiconductor layer; and after said forming the first source/drain and the second source drain in the semiconductor layer, forming a first conductive gate object on a second side wall of the first fin, wherein the first conductive gate object is electrically insulated from the first fin, the first source/drain, and the second source/drain.

2. The method of claim 1, further comprising:
etching the second spacer so as to form a fourth spacer on a third side wall of the first conductive gate;
using the fourth spacer as a blocking mask to etch the semiconductor layer so as to form a second fin on the third side wall of the first conductive gate; and
forming a second conductive gate object on a fourth side wall of the second fin, wherein the second conductive gate object is electrically insulated from the second fin, and the first source/drain and the second source/drain.

3. The method of claim 1, further comprising etching the first conductive gate object to form a third conductive gate, wherein a first gate capacitance between the first conductive gate and the first source/drain is at least 1.5 times a second gate capacitance between the third conductive gate and the first source/drain.

4. The method of claim 1, further comprising etching the first conductive gate object to form a third conductive gate,
wherein a first width of the third conductive gate in a reference direction is at least 1.5 times a second width of the first conductive gate region in the reference direction, and
wherein the first fin and the first gate dielectric layer comprise a common interfacing surface, and
wherein the reference direction is perpendicular to the common interfacing surface.

5. The method of claim 1, further comprising etching the first conductive gate object to form a third conductive gate,
wherein a second gate distance between the third conductive gate and the first source/drain in a reference direction is at least 1.5 times a first gate distance between the first conductive gate and the first source/drain in the reference direction,
wherein the first source/drain and the first gate dielectric layer comprise a common interfacing surface, and
wherein the reference direction is perpendicular to the common interfacing surface.

6. The method of claim 1, wherein said forming the sacrificial back gate comprises forming the sacrificial back gate comprising silicon dioxide around the first spacer.

7. The method of claim 6, wherein said forming the first spacer comprises forming the first spacer comprising a first nitride material on the semiconductor layer, and wherein said forming the second spacer comprises forming the second spacer comprising a second nitride material around the sacrificial back gate.

* * * * *